United States Patent [19]

Zuffada et al.

[11] Patent Number: 5,365,193
[45] Date of Patent: Nov. 15, 1994

[54] CIRCUIT FOR NEUTRALIZING THERMAL DRIFT IN A TRANSCONDUCTANCE STAGE

[75] Inventors: Maurizio Zuffada, Milan; Gianfranco Vai, Pavia; Marco Gregori, Milan; David Moloney, Cornaredo; Giorgio Betti, Milan, all of Italy

[73] Assignee: SGS-Thomson Microelectronics s.r.l., Milan, Italy

[21] Appl. No.: 982,376

[22] Filed: Nov. 25, 1992

[30] Foreign Application Priority Data

Nov. 26, 1991 [IT] Italy ............................ MI91A003144

[51] Int. Cl.⁵ .......................................... H03F 3/45
[52] U.S. Cl. .................................. 330/253; 330/256; 330/300
[58] Field of Search ............... 330/256, 253, 289, 300

[56] References Cited

U.S. PATENT DOCUMENTS

| | | | |
|---|---|---|---|
| 4,301,421 | 11/1981 | Yokoyama | 330/253 |
| 4,388,539 | 6/1983 | Boeke | 307/491 |
| 4,618,833 | 10/1986 | Russell | 330/256 |
| 4,887,048 | 12/1989 | Krenik et al. | 330/258 |
| 4,897,613 | 7/1993 | Rao et al. | 330/253 |

FOREIGN PATENT DOCUMENTS

2947771A1  6/1980  Germany .

Primary Examiner—William L. Sikes
Assistant Examiner—Jim Dudek
Attorney, Agent, or Firm—Seed and Berry

[57] ABSTRACT

A circuit device for neutralizing thermal drift in a transconductor differential stage using a first circuit portion which corresponds structurally to the transconductor differential stage and has a pair of MOS input transistors defining a transconductance value which is substantially proportional to that of the transconductor differential stage, a pair of bipolar output transistors coupled to the MOS input transistors in a cascode configuration, and a second circuit portion being supplied a current from an output of the first differential portion to thereby output a current to be passed to the transconductor differential stage. The value of the output current is inversely proportional to temperature-dependent parameters of the transconductance.

20 Claims, 2 Drawing Sheets

CIRCUIT FOR NEUTRALIZING THERMAL DRIFT IN A TRANSCONDUCTANCE STAGE

TECHNICAL FIELD

This invention relates to a circuit device for neutralizing thermal drift in a transconductor differential stage.

BACKGROUND OF THE INVENTION

Specifically in the field of application of this invention, it is known to provide time-continued integrated filters, using a transconductor stage as the filter base block. That technique has been developed in recent years and already seems to be the most effective for high-frequency applications. This is most likely attributable to that, in a transconductor filter, the voltage/current conversion step is carried out in an open-loop system, and accordingly, the so-called non-dominant pole of the converter suffers no limitations from the unit frequency gain of an operational amplifier, as is instead the case with filters in the MOSFET-C technology.

However, transconductor filters also have the disadvantage of being uniquely affected by temperature changes while in operation. This results in the transconductance value fluctuating, which may be undesirable for many applications.

The underlying technical problem of this invention is to provide a circuit device which has such structural and functional characteristics as to neutralize the dependence of the differential stage transconductance on temperature, thereby overcoming the limitations imposed on current embodiments.

SUMMARY OF THE INVENTION

The solutive idea on which the invention stands is one of supplying the transconductor differential stage with a current related to those same parameters which cause the transconductance to change, but in an inversely proportional way.

Based on this idea, the technical problem is solved by a circuit device as indicated being characterized in that it comprises a first circuit portion which corresponds structurally to the transconductor differential stage and generates a current proportional to a differential voltage at the input of the inventive circuit. A second stage receives the proportional current and outputs a current to the transconductor differential stage, with the value of the output current being inversely proportional to temperature—dependent parameters of the transconductance. In one embodiment, the first circuit portion has a pair of MOS input transistors defining a transconductance value which is substantially proportional to that of the transconductor stage, and a second pair of bipolar output transistors coupled to the aforementioned ones in a cascode configuration, and a second circuit portion which comprises means being supplied a current from an output of said first differential portion to thereby output a current to be passed to the stage whose value is inversely proportional to temperature-dependent parameters of the transconductance.

By supplying such an output current to the transconductor stage, the stage transconductance can be made unaffected by temperature.

The features and advantages of a device according to the invention will become apparent from the following detailed description of an embodiment thereof, given by way of non-limitative example with reference to the accompanying drawings.

DETAILED DESCRIPTION OF THE INVENTION

Figure 1:
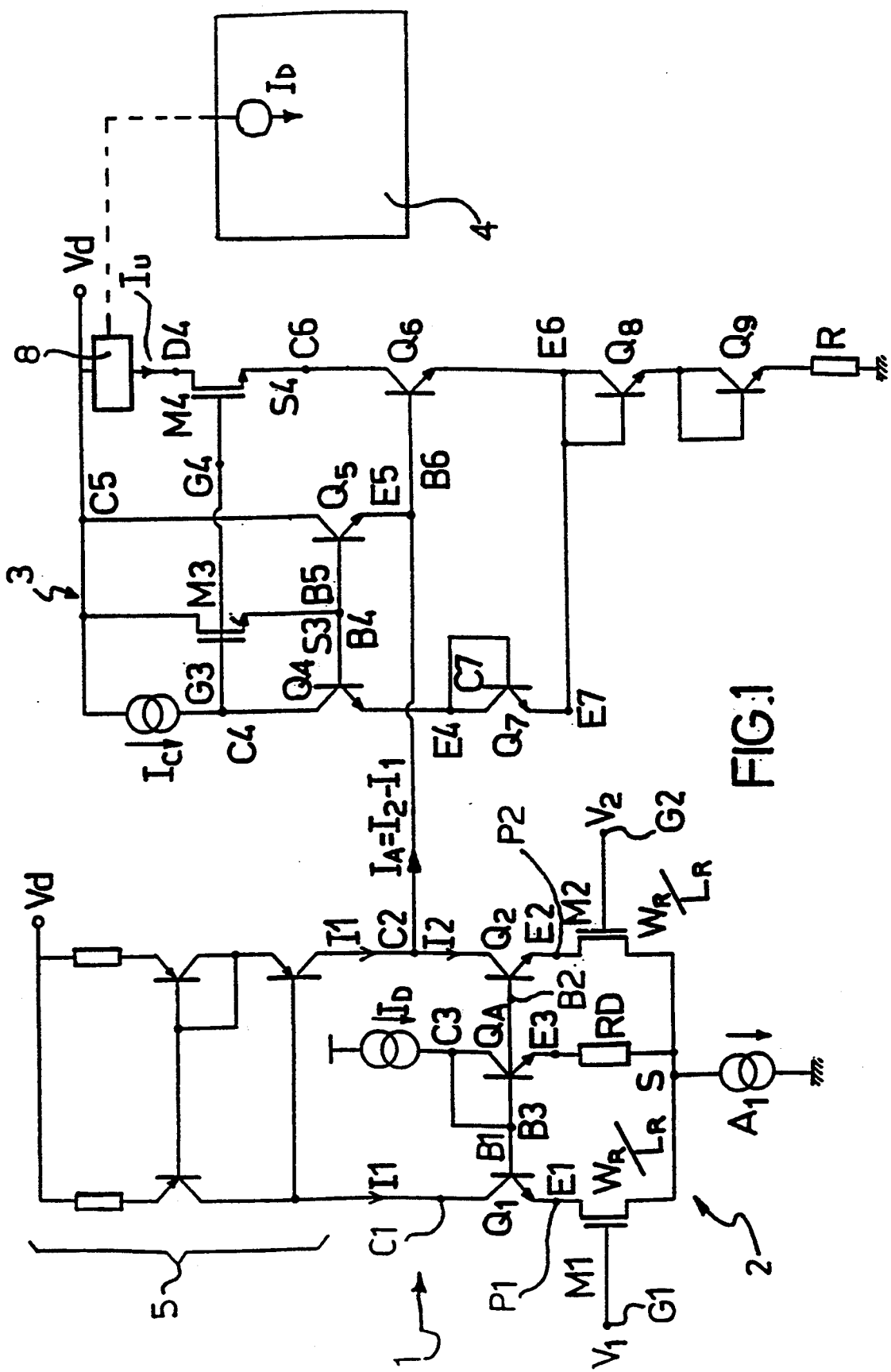
FIG. 1 is a diagram of a circuit device embodying the invention, shown coupled to a transconductor differential stage.

With reference to the drawing figures, generally and diagramatically shown by the reference numeral 1 is a circuit device embodying this invention and intended for coupling to a transconductor differential stage 4.

More particularly, the circuit 1 is adapted to accommodate and neutralize the thermal drift of the stage 4, which is implemented by a combination technology to include both transistors of the bipolar type and the MOS type.

Advantageously, according to the invention, this device 1 comprises a first circuit portion 2 which corresponds structurally to the transconductor differential stage 4, of which no detailed description will, therefore, be given herein.

That differential cell portion 2 includes an input formed of a pair of N-channel MOS transistors M1, M2 having respective source terminals shared at a node S.

The gate terminal of the transistor M1 constitutes a non-inverting input for the differential portion 2 and receives a voltage signal V1, whereas the gate G2 of the transistor M2 is the inverting input and receives a signal V2. Connected between the sources S and ground is a current generator A1 whose value, as given by the relation $A1=2Io+Id$, is dependent on the values of other current generators present in the differential portion 2 and described hereinafter.

Also provided in the differential portion 2 is an output circuit portion comprising a pair of npn bipolar transistors Q1 and Q2 having respective bases B1, B2 connected to each other. These bipolar transistors Q1, Q2 are coupled to the aforesaid MOS transistors M1, M2 in a so-called cascode configuration with respective emitters E1, E2 connected to the drain terminals P1, P2, respectively, of the MOS transistor pair.

The collectors C1 and C2 of transistors Q1, Q2 constitute instead output terminals for differential portion 2. Through each transistor Q1, Q2, a corresponding current, I1, I2, flows, and the sum of these currents is constant and equal 2Io. A current mirror circuit 5 is provided between a voltage supply pole Vd and those legs of differential portion 2 which are run to said collectors C1 and C2.

The structure of the differential portion 2 is completed by a third transistor QA of the npn bipolar type having its base B3 connected to the bases B1 and B2, and its emitter E3 connected to the sources S via a resistor RD. This third transistor has its collector C3 connected, in turn, to a current generator Id; moreover, transistor QA is a diode configuration with the base B3 and the collector C3 connected to each other. The description provided so far also applies substantially to the structure of the transconductor stage 4.

The circuit device 1 of this invention further comprises a second circuit portion 3 which incorporates a pair of bipolar transistors Q4 and Q5 of the npn type having their bases B4, B5 in common. The transistor Q4 has its collector C4 connected to the voltage supply pole Vd via a current generator Ic, and the collector C5 of the second transistor Q5 in the pair is connected to the voltage supply pole Vd directly.

The emitter E5 of the transistor Q5 is connected to an output of the previous differential portion 2, specifically to the collector C2 of the bipolar transistor Q2, and flowing thereto is, by the set bias conditions, a current Ia=I2−I1 whose value will be discussed hereinafter. The emitter E5 is also connected to the base B6 of a transistor Q6 of the npn bipolar type.

The transistor Q6 has its emitter E6 in common with the emitter E7 of a transistor, Q7, also an npn bipolar type, which is connected in the second portion 3 in a diode configuration and has its collector C7 connected to the emitter E4 of the aforesaid transistor Q4 in the pair Q4, Q5.

The emitters E6 and E7 are connected to ground through the series of a resistor R and two bipolar transistors QS, Q9, both configured as diodes with each transistor QS, Q9 having its respective base in common with the collector.

Portion 3 is also implemented with a bipolar-MOS combination technology, and further comprises a pair of MOS transistors M3, M4 having respective gate terminals G3, G4 connected to each other and to the collector C4 of the bipolar transistor Q4.

The MOS transistor M3 is connected in the circuit with its drain terminal D3 connected to the voltage supply Vd and its source S3 connected to bases B4, B5. The other MOS transistor M4 has its drain terminal D4 arranged to constitute the current output of device 1 and its source S4 connected to the collector C6 of transistor Q6.

The drain D4 receives a current Iu from a current mirror 8 which is inversely proportional to those parameters on which the transconductance gm of stage 4 is dependent by direct proportionality.

The operation of the circuit device 1 of this invention will now be discussed.

The transistors M1, M2 at the input of the first differential portion 2 are biased to their linear operation zone, and accordingly, perform a linear voltage-to-current conversion establishing the value of the differential cell transconductance gm. This transconductance may be seen as the incremental ratio of the change in output current Iout to the change in input voltage Vin; therefore $$gm = \check{S}Iout/\check{S}Vin = \mu Cox\, RD\, Id\, W/L; \quad (1)$$

where W and L are the amplitude and width, respectively, of the MOS transistor channel regions; and $\mu$ and Cox are known parameters of each transistor.

When the transistors M1, M2 are biased to the linear operation zone, a corresponding current I1, I2, respectively, flows through them, and the value of each current is given by the following relation:

$$I = \mu Cox[(Vgs-Vt)Vds - (Vds)2/2]W/L; \quad (2)$$

where Vgs is the gate/source voltage drop; Vt is the threshold voltage; and Vds is the drain/source voltage drop.

If the difference between the voltage signals V1, V2 being applied to the inputs G1, G2 is such that the drain/source voltage drops Vds across transistors M1 and M2 are made nearly identical, then it can be shown that:

$$Ia = I2-I1 = \mu Cox Vds\, Vr\, Wr/Lr = \mu Cox\, Id\, RD\, Vr\, Wr/Lr; \quad (3)$$

where Vr is the difference V2−V1; and Wr and Lr are the dimensional parameters of transistors M1 and M2.

Let us consider now the second circuit portion 3, for which the equality of the sum of the base/emitter voltage drops Vbe of transistors Q4 and Q7 to that of transistors Q5 and Q6 can be noted as by the following equation:

$$Vbe(Q4) + Vbe(Q7) = Vbe(Q5) + Vbe(Q6). \quad (4)$$

The bipolar transistors Q4 and Q7 of the device 1 are passed the same current Ic, whereas transistor Q5 is passed a current Ia=I2−I1, and transistor Q6 a current Iu. It thus becomes possible to transform equation (4) for the values of such currents, using the relation:

$$I = A\, Js\, e^{Vbe/Vt}; \quad (5)$$

where A is the area of a transistor; and Js is a current density which depends on the transistor characteristics.

The transformation yields the following equation:

$$(kT/q)\ln[Ic^2/A(Q4)A(Q7)Js^2] = \\ = (kT/q)\ln[(Ia\, Iu)/A(Q5)A(Q6)Js^2] \quad (6)$$

and by taking the areas of transistors Q4, Q5, Q6, and Q7 to be identical, the following holds:

$$Iu = Ic^2/Ia = Ic^2/\mu Cox\, Vr\, Id\, RD(Wr/Lr). \quad (7)$$

Substituting the value just found for current Iu into equation (1), such that it will coincide with Id, that is taking Iu as the current to be applied to the transconductor stage 4, the following is obtained:

$$gm = (W/L)(Lr/Wr)Ic^2/Vr\, Id. \quad (8)$$

Equation (8) demonstrates that, where the so-called thermal coefficients CT of generators Ic and Id and of the voltage difference Vr are nil, the value of the transconductance gm of stage 4 becomes independent of temperature.

Stated otherwise, where a suitably mirrored current Id=Iu is supplied to the transconductor stage 4 in a manner known per se, it is sufficient that the voltage Vr be stable and that the current generators Ic and Id be implemented such that they are unaffected by temperature, to have said transconductor stage 4 exhibit a stable transconductance value gm.

As for voltage Vr, this may be derived from a temperature-stable bandgap voltage, and examples of current generators unrelated to temperature are known from the relevant literature, such as from Gray & Meyer "Analysis and Design of Integrated Circuits", published by Wiley, pages 248-254.

However, the alternative choice of supplying such currents Ic and Id from stable and accurate external devices exists. The circuit device 1 of this invention does solve the technical problem of neutralizing the dependence of the differential stage 4 transconductance on temperature.

In many applications, however, it will be necessary to vary the transconductance value to meet contingent demands. From equation (8) it is also inferred that to provide a variable transconductance, one could act on the current Ic of the circuit 1. By supplying different predetermined values of the current Ic, correspondingly different transconductance values can be obtained for stage 4.

Figure 2:
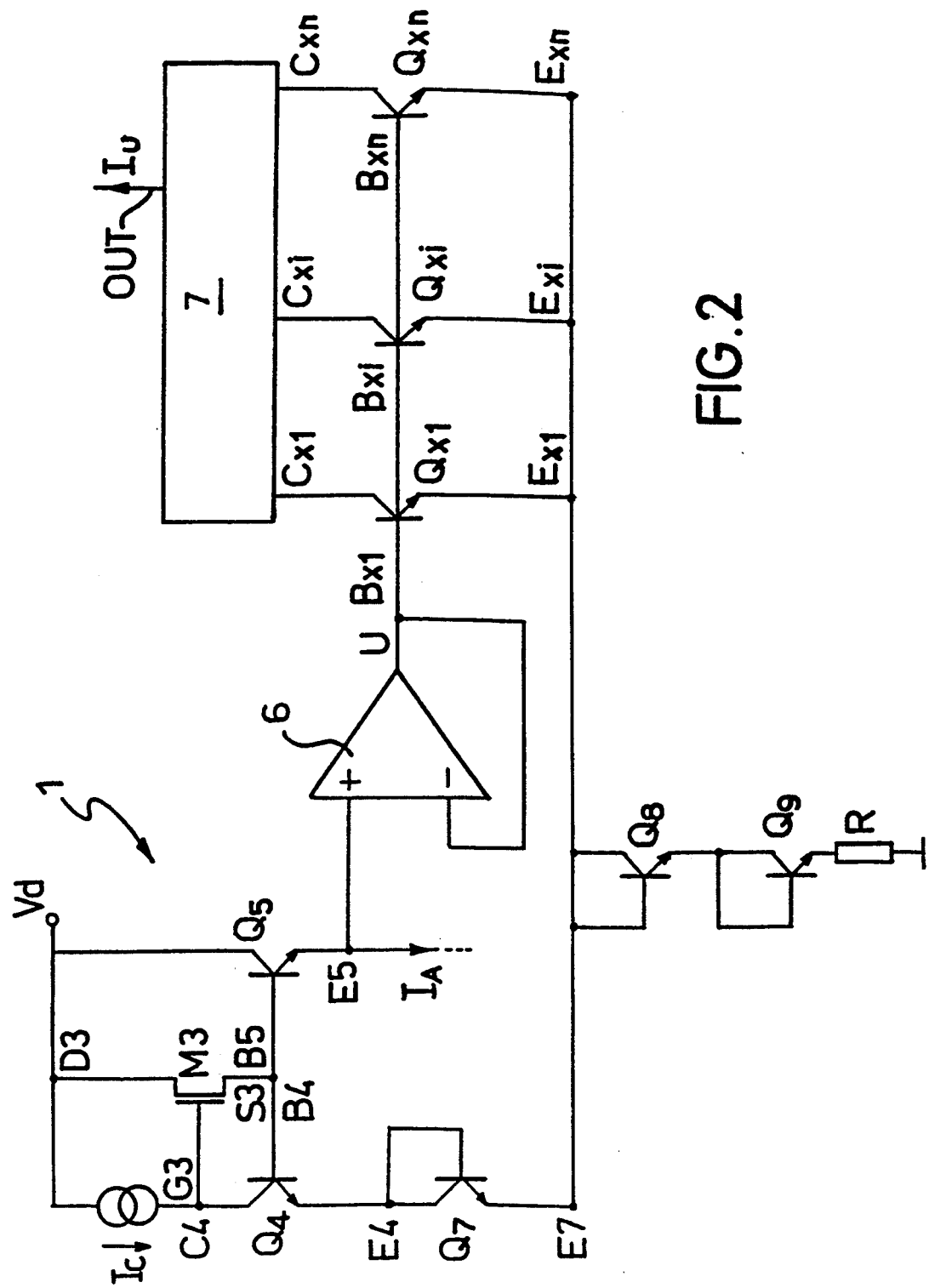
FIG. 2 is a diagram of a variant of the device shown in FIG. 1.

The embodiment shown in FIG. 2 is proposed for this purpose wherein transistor Q6 of the circuit device 1 has been replaced with an operational amplifier 6 and a plurality of n transistors. In particular, the amplifier 6 has its non-inverting (+) input connected to the emitter E5 of transistor Q5 and its output U fed back to the inverting (−) input.

The output U is also connected to all the bases of a plurality of n transistors Qx1 ... Qxn connected in parallel with one another. The emitters Exi of plurality of n transistors are all connected together and to the emitter E7 of transistor Q7. The various collectors Cxi are instead run to a multiple commutator 7, characterized by an output OUT, from which a current is made available for possible use as the current Iu to be supplied to the transconductor stage 4.

This embodiment prevents the base current of transistor Q6 from affecting the value of the current Ia flowing through the transistor Q5. The base currents of the various transistors Qxi are supplied from the amplifier 6, which being connected as a unit gain stage and under the effect of a virtual ground, will maintain its output at the same voltage level as the emitter E5. The several different currents on the collectors Cxi enable the transconductance value gm to be controlled.

We claim:

1. A circuit device for neutralizing thermal drift in a transconductor differential stage, comprising:
    a first differential circuit portion corresponding structurally to the transconductor differential stage and having a first and second MOS input transistors defining a transconductance value which is substantially proportional to that of the transconductor differential stage;
    a first and second bipolar output transistors coupled to said first and second MOS input transistors in a cascode configuration; and
    a second circuit portion being supplied a current from an output of said first differential circuit portion for outputting an output current to be passed to the transconductor differential stage, said output current having a value inversely proportional to temperature-dependent parameters of the transconductance.

2. A device according to claim 1 wherein said second circuit portion comprises:
    first and second bipolar transistors with their bases in common, said second bipolar transistor having its collector connected to a voltage supply pole;
    a current generator connected to the collector of said first bipolar transistor; and
    third and fourth bipolar transistors with their emitters in common, the base of said third bipolar transistor connected to the emitter, of said second bipolar transistor, said fourth bipolar transistor being in diode configuration with the collector of said fourth bipolar transistor connected to the emitter of said first bipolar transistor, the emitter of said second bipolar transistor being connected to said output of said first differential circuit portion.

3. A device according to claim 2, further including first and second MOS transistors having respective gate terminals connected together and to the collector of said first bipolar transistor, the drain of said first MOS transistor connected to said voltage supply pole, the drain of said second MOS transistor connected to said voltage supply pole through a current mirror, the source of said first MOS transistor connected to said common base of said first and second bipolar transistors, the source of said second MOS transistor connected to the collector of said third bipolar transistor.

4. A device according to claim 3, characterized in that the value of said current mirror associated with the drain of said second MOS transistor is given by the following formula:

$$Iu = Ic^2/Ia = Ic^2/\mu Cox\ Vr\ Id\ RD(Wr/Lr),$$

where Vr is the difference between the voltage values of the signal being applied to the gates of said first and second MOS input transistors, Wr and Lr are the amplitude and width of the channel region of said first and second MOS input transistors, $\mu$ and Cox are known parameters of said first and second MOS input transistors, and Id RD is the drain-source voltage drop across said first and second MOS input transistors.

5. A device according to claim 2 wherein said common emitters of said third and fourth bipolar transistors are connected to ground through a series of a resistor and at least one bipolar transistor in diode configuration.

6. A device according to claim 1, said second circuit portion comprises:
    first and second bipolar transistors with their bases in common, said second bipolar transistor having its collector connected to a voltage supply pole;
    a current generator connected to the collector of said first bipolar transistor:
    an operational amplifier having a non-inverting input connected to the emitter of said second bipolar transistor, and an output in feedback connection with the inverting input and directly connected to each of the bases of a plurality of bipolar commutator transistors:
    a multiple commutator having inputs connected to the collectors of said plurality of commutator transistors: and
    a diode configured transistor in diode configuration with a collector of said diode configured transistor connected to the emitter of said first bipolar transistor and an emitter of said diode configured transistor connected in common with the emitters of said plurality of transistors, the emitter of said second bipolar transistor being connected to said output of said first differential circuit portion.

7. A device according to claim 6 wherein said multiple commutator has an output applied to the transconductor differential stage to supply it with a current which is inversely proportional to temperature-dependent parameters of the transconductance.

8. A device according to claim 6, further including a MOS transistor having its gate terminal connected to the collector of said first bipolar transistor, its drain terminal connected to a voltage supply pole, and its source terminal connected to said common bases of said first and second bipolar transistors.

9. A device according to claim 6, characterized in that said common emitters of said diode configured transistor and said plurality of commutator transistors are connected to ground through the series of a resistor and at least one bipolar transistor in diode configuration.

10. A circuit for compensation of thermal drift in a transconductance amplifier, the circuit comprising:
- a first transconductance stage structurally similar to the transconductance amplifier and generating a current proportional to a differential voltage applied to a first and second differential inputs; and
- a second stage receiving said current from said first transconductance stage and outputting an output current to the transconductance amplifier, the value of said output current being inversely proportional to temperature-dependent parameters of the transconductance.

11. The circuit of claim 10 wherein said first transconductance stage has a transconductance substantially equal to the transconductance of the transconductance amplifier.

12. The circuit of claim 10 wherein said second stage comprises:
- a first and second bipolar output transistors having a common base node, the collector of said first bipolar output transistor receiving a constant current substantially independent of temperature, the collector of said second bipolar output transistor receiving a current equal to said output current;
- a semiconductor device delivering a current having a value determined by the equation:

$$I_3 = I_1^2 / I_2$$

where $I_3$ equals the current by said semiconductor device, $I_1$ equals the current flowing through said first bipolar output transistor, and $I_2$ equals the current flowing through said second bipolar output transistor; and
- a current mirror circuit generating a mirror current substantially equal in value to the current delivered by said semiconductor device, said mirror current being supplied to the transconductance amplifier as said output current.

13. The circuit of claim 12 wherein said semiconductor device is a third bipolar output transistor having a base coupled to the emitter of said second bipolar output transistor.

14. The circuit of claim 12 wherein said semiconductor device comprises:
- an operational amplifier and a plurality of commutator transistors, said operational amplifier having a non-inverting input coupled to the emitter of said second bipolar output transistor, an operational amplifier output being coupled to an inverting input and to bases of said plurality of commutator transistors; and
- a commutator with a plurality of inputs, each of said plurality of inputs coupled to a collector of said plurality of commutator transistors, and delivering a commutator current as said output current, the value of said commutator current being selected by said commutator, whereby a plurality of transconductance values for the transconductance amplifier may be selected by selectively allowing current to flow through a single one of said plurality of commmutator transistors.

15. A circuit for compensation of thermal drift in a transconductance amplifier, the circuit comprising:
- a first transconductance stage structurally similar to the transconductance amplifier and generating a current proportional to a differential voltage applied to a first and second differential inputs, said first transconductance stage having a transconductance proportional to the transconductance of the transconductance amplifier; and
- a second stage receiving said current from said first transconductance stage and outputting an output current to the transconductance amplifier, the value of said output current being inversely proportional to temperature-dependent parameters of the transconductance.

16. The circuit of claim 15 wherein said first transconductance stage contains first and second MOS input transistors to form a differential input pair, and first and second bipolar transistors coupled to said differential input pair in a cascode configuration to generate said output current.

17. The circuit of claim 16 wherein said first and second MOS transistors are biased for linear operation and provide a voltage to current conversion to establish the transconductance of said first transconductance stage.

18. The circuit of claim 15 wherein said second stage comprises:
- a first and second bipolar output transistors having a common base node, the collector of said first bipolar output transistor receiving a construct current substantially independent of temperature, the collector of said second bipolar output transistor receiving a current equal to said output current;
- a semiconductor device delivering a current having a value determined by the following equation:

$$I_3 = I_1^2 / I_2$$

where $I_3$ equals the current by said semiconductor device, $I_1$ equals the current flowing through said first bipolar output transistor, and $I_2$ equals the current flowing through said second bipolar output transistor; and
- a current mirror circuit generating a mirror current substantially equal in value to the current delivered by said semiconductor device, said mirror current being supplied to the transconductance amplifier as said output current.

19. The circuit of claim 18 wherein said semiconductor device is a third bipolar output transistor having a base coupled to the emitter of said second bipolar output transistor.

20. The circuit of claim 18 wherein said semiconductor device comprises:
- an operational amplifier and a plurality of commutator transistors, said operational amplifier having a non-inverting input coupled to the emitter of said second bipolar output transistor, an operational amplifier output being coupled to an inverting input and to bases of said plurality of commutator transistors; and
- a commutator with a plurality of inputs, each of said plurality of inputs coupled to a collector of said plurality of commutator transistors, and delivering a commutator current as said output current, the value of said commutator current being selected by said commutator, whereby a plurality of transconductance values for the transconductance amplifier may be selected by selectively allowing current to flow through a single one of said plurality of commutator transistors.

* * * * *

UNITED STATES PATENT AND TRADEMARK OFFICE
CERTIFICATE OF CORRECTION

PATENT NO. : 5,365,193
DATED : November 15, 1994
INVENTOR(S) : Maurizio Zuffada et al.

It is certified that error appears in the above-identified patent and that said Letters Patent is hereby corrected as shown below:

In column 7, claim 12, line 28, after "the" and before "equation:", please insert --following--.

In column 8, claim 18, line 27, please delete "construct" and substitute therefor --constant--.

Signed and Sealed this

Twenty-eight Day of March, 1995

*Attest:*

BRUCE LEHMAN

*Attesting Officer*     *Commissioner of Patents and Trademarks*